US009113576B2

(12) United States Patent
Daly

(10) Patent No.: US 9,113,576 B2
(45) Date of Patent: Aug. 18, 2015

(54) THERMAL MANAGEMENT OF PHOTONICS ASSEMBLIES

(71) Applicant: Alcatel Lucent, Paris (FR)

(72) Inventor: John Daly, Teralee (IE)

(73) Assignee: Alcatel Lucent, Boulogne-Billancourt (FR)

( * ) Notice: Subject to any disclaimer, the term of this patent is extended or adjusted under 35 U.S.C. 154(b) by 328 days.

(21) Appl. No.: 13/690,450

(22) Filed: Nov. 30, 2012

(65) Prior Publication Data

US 2013/0146253 A1 Jun. 13, 2013

(30) Foreign Application Priority Data

Dec. 13, 2011 (EP) .................................. 11290573

(51) Int. Cl.
*H05K 7/20* (2006.01)
*H01S 5/024* (2006.01)
(Continued)

(52) U.S. Cl.
CPC .......... *H05K 7/20281* (2013.01); *H01L 23/473* (2013.01); *H01S 5/02423* (2013.01); *H01L 2924/0002* (2013.01); *H01S 3/0407* (2013.01)

(58) Field of Classification Search
CPC ............... H05K 7/20218–7/20381; H05K 7/20409–7/20418; H01L 23/367–23/3677; G06F 1/181–1/182; F28F 3/02; F28F 13/06–13/125
USPC ........... 361/679.46–679.54, 688–723, 361/676–678; 165/104.33, 80.1–80.5, 185; 257/712–722; 174/547–548, 174/15.1–15.3, 16.1–16.3
See application file for complete search history.

(56) References Cited

U.S. PATENT DOCUMENTS

| 4,805,420 A * | 2/1989 | Porter et al. ................... 62/51.1 |
| 5,103,374 A | 4/1992 | Azar |
| 5,889,651 A | 3/1999 | Sasaki et al. |

(Continued)

FOREIGN PATENT DOCUMENTS

| EP | 0458500 B1 | 8/1995 |
| EP | 0709884 A2 | 5/1996 |

(Continued)

OTHER PUBLICATIONS

Dierl, B. et al. "Temperature Exchange for Electrical and Mechanical Components," *IBM Technical Disclosure Bulletin*, International Business Machine Corp. vol. 19, No. 10, Mar. 1, 1997 XP-002071530.

(Continued)

*Primary Examiner* — Anthony Haughton
*Assistant Examiner* — Razmeen Gafur
(74) *Attorney, Agent, or Firm* — Harness, Dickey & Pierce, P.L.C.

(57) ABSTRACT

A photonics assembly (8-16) is housed within an hermetically sealed container (24) mounted within an outer container (20), and is cooled by a fluidic arrangement comprising a liquid flow path (28) defined between the outer container and the sealed container, the outer container having a liquid inlet and a liquid outlet (30, 32), whereby cooling liquid can flow around the hermetically sealed container to remove heat. The photonics assembly including photonics devices, has a composite thermally conductive substrate (17, 19) contacting a thermally conductive wall (22) of the sealed container, whereby the cooling liquid cools said photonics devices. Liquid flow passageways (48-66) are provided in wall (22) and substrate (17, 19) for improving fluidic cooling.

16 Claims, 6 Drawing Sheets

(51) Int. Cl.
*H01L 23/473* (2006.01)
*H01S 3/04* (2006.01)

(56) References Cited

U.S. PATENT DOCUMENTS

| | | | |
|---|---|---|---|
| 6,729,383 B1 * | 5/2004 | Cannell et al. | 165/80.3 |
| 7,040,383 B2 * | 5/2006 | Oyamada | 165/104.33 |
| 7,104,312 B2 * | 9/2006 | Goodson et al. | 165/80.4 |
| 7,252,167 B2 * | 8/2007 | Nakamura et al. | 180/68.4 |
| 7,285,851 B1 * | 10/2007 | Cepeda-Rizo et al. | 257/712 |
| 7,431,071 B2 * | 10/2008 | Wenger | 165/47 |
| 7,537,048 B2 * | 5/2009 | Liu et al. | 165/104.33 |
| 7,551,439 B2 * | 6/2009 | Peugh et al. | 361/699 |
| 7,604,040 B2 * | 10/2009 | Ghosh et al. | 165/80.3 |
| 7,753,662 B2 * | 7/2010 | Lai et al. | 417/423.9 |
| 7,961,475 B2 * | 6/2011 | Campbell et al. | 361/748 |
| 8,514,590 B2 * | 8/2013 | Nakasaka et al. | 361/831 |
| 2003/0080413 A1 * | 5/2003 | Dubhashi | 257/714 |
| 2004/0008490 A1 * | 1/2004 | Cheon | 361/699 |
| 2004/0190255 A1 * | 9/2004 | Cheon | 361/699 |
| 2005/0254214 A1 * | 11/2005 | Salmon | 361/699 |
| 2006/0002081 A1 * | 1/2006 | Hongo et al. | 361/691 |
| 2006/0162898 A1 * | 7/2006 | Reyzin et al. | 165/80.4 |
| 2006/0162903 A1 * | 7/2006 | Bhatti et al. | 165/104.14 |
| 2006/0162904 A1 * | 7/2006 | Bhatti et al. | 165/104.14 |
| 2007/0095507 A1 * | 5/2007 | Henderson et al. | 165/104.26 |
| 2007/0183125 A1 * | 8/2007 | Tilton et al. | 361/699 |
| 2008/0055852 A1 | 3/2008 | Uluc et al. | |
| 2008/0110598 A1 * | 5/2008 | Henderson et al. | 165/104.26 |
| 2008/0264604 A1 * | 10/2008 | Campbell et al. | 165/80.4 |
| 2009/0279257 A1 * | 11/2009 | Lower et al. | 361/699 |
| 2009/0316360 A1 * | 12/2009 | Campbell et al. | 361/699 |
| 2010/0039773 A1 * | 2/2010 | Tilton et al. | 361/699 |
| 2010/0085713 A1 * | 4/2010 | Balandin et al. | 361/705 |
| 2010/0101759 A1 * | 4/2010 | Campbell et al. | 165/80.4 |
| 2010/0202108 A1 | 8/2010 | Uluc et al. | |
| 2010/0315779 A1 * | 12/2010 | Chiu-Mao et al. | 361/699 |
| 2011/0149517 A1 | 6/2011 | Uluc et al. | |
| 2011/0164385 A1 * | 7/2011 | Hou et al. | 361/699 |
| 2011/0170263 A1 | 7/2011 | Uluc et al. | |
| 2011/0188204 A1 * | 8/2011 | Horiuchi et al. | 361/702 |
| 2011/0216505 A1 | 9/2011 | Uluc et al. | |
| 2011/0313576 A1 * | 12/2011 | Nicewonger | 700/282 |
| 2011/0317365 A1 * | 12/2011 | Tang | 361/699 |

FOREIGN PATENT DOCUMENTS

| | | |
|---|---|---|
| JP | 2005045062 A | 2/2005 |
| JP | 2008235139 A | 10/2008 |
| JP | 2008244182 A | 10/2008 |
| WO | WO-2006133238 A2 | 12/2006 |

OTHER PUBLICATIONS

European Search Report for EP Application No. 11290573 dated Apr. 17, 2012.

* cited by examiner

THERMAL MANAGEMENT OF PHOTONICS ASSEMBLIES

TECHNICAL FIELD

The present invention relates to thermal management of optical and/or electrical component assemblies, particularly though not exclusively photonics component assemblies.

BACKGROUND ART

The current common method of controlling the temperature of photonics assemblies, for example one or more photonics devices mounted in a circuit pack, is the use of thermoelectric modules (TE). These are very inefficient modes of thermal control. Photonic sub-assemblies typically operate at a fixed temperature but are placed within modules and on circuit packs where they can have a requirement as the lowest temperature component, which results in heat load being drawn into the package. Currently one solution uses a heat spreading material in conjunction with a thermoelectric module. The module is powered to maintain a set point temperature and localized heating methods are employed to control specific component or location temperatures. For optic components this involves the addition of localized heaters to bring the local component up from the ambient temperature set by the thermoelectric module. Due to the thermal conductivity of the materials used, thermal crosstalk becomes an issue, resulting in more power required to drop the bulk thermoelectric module temperature. Thermal crosstalk is where the temperature of one active component affects another one. Thermal crosstalk results in larger power consumption by the thermoelectric modules and laser heaters.

Electronics chips do not usually use TE cooling, since TE cooling is inefficient, and further with electronics chips the main issue is to extract a large amount of heat, rather than controlling chip temperature precisely. Common arrangements used for cooling electronics chips are the use of fluidic cooling and/or fan air cooling.

SUMMARY OF THE INVENTION

Therefore a method suitable for efficiently isolating photonics assemblies while maintaining a fixed set-point temperature and dissipating the heat load generated is required.

Various embodiments provide thermal management apparatus for a photonics assembly, comprising an hermetically sealed container mounted within an outer container, a liquid flow path being defined between said outer container and said sealed container, and the outer container having a liquid inlet and a liquid outlet, whereby cooling liquid can flow around the hermetically sealed container to remove heat therefrom. The hermetically sealed container contains a photonics assembly comprising one or more photonics devices, which are in thermal communication with a thermally conductive wall portion of said sealed container, whereby said cooling liquid cools said photonics devices.

Fluidic cooling has not previously been used for photonics assemblies, because of problems with temperature control and isolation of photonics components from the fluid medium, photonics devices normally being operated in an air environment. In accordance with common practice, an hermetically sealed container is provided for protection of optical components formed of III-V materials and other components. Usually, the sealed container is filled with an inert gas such as Argon or Nitrogen, which also provides a clear optical path for free-standing optical components.

It will be understood that for the purposes of this specification, fluidic cooling is generally to be understood as cooling by liquid, and references to "fluid" herein are to be understood as primarily references to "liquid". However, two phase cooling is envisaged, wherein a liquid is employed having a boiling point such that the liquid boils into vapour when performing a cooling action on the hermetically sealed container.

Although embodiments are concerned with photonics equipment, other embodiments may be implemented for cooling other types of electrical or optical equipment, for example free-standing optics or equipment containing III-V material, which are required to be housed in an hermetically sealed container.

Said one or more photonics devices may be mounted on a thermally conductive substrate such as Silicon (Si), which may form a base region of the sealed container. Alternatively, a thermally conductive base plate assembly may be provided which is thermally coupled to the photonics devices, and which either forms a base part of the sealed container, or is in good thermal contact therewith. At least this base portion of the sealed container is of thermally conductive material such as metal so as to permit heat to be conducted away by fluid, to which it is exposed, so as to permit the photonics devices to be maintained at a desired temperature. The casing of the sealed container may be formed wholly of metal, that is the base, side walls and top. Alternatively, in one embodiment, the top may be of thermally insulative material and functions additionally to form the top of the outer container. The outer container is formed as a separate item from the sealed container, as preferred of a thermally insulating material such as plastics. Thus the sealed container is surrounded by thermally insulating material. This is an added advantage where the containers are mounted on a circuit pack in a "hot" environment where fan air cooling is employed to cool power consuming electronics components. The insulating outer casing isolates the sealed container from the hot external environment, and the fluid flow conducts away a required amount of heat from the optical devices. Alternatively, in other embodiments the outer container may be formed of a thermally conductive material, in circumstances where the external environment may provide a cooling effect. The outer container may be a completely separate item for the sealed container; as preferred it is formed as a container which makes a close fit with the sealed container, or is a plastics extrusion, moulded onto the surface of the sealed container. A top plate is of a thermally insulative material.

The base floor of the outer container in its inner surface may be formed with fluidic structures or formations to direct fluid flow around the base region, and avoid the formation of stagnant areas. Alternatively such structures may be preformed on a board which is then fitted into the base of the outer container. In addition, structures may be provided which encourage speeding up of fluid flow, by means of the Bernoulli Effect, close to the base of the sealed container in regions where hot optical components are located, so as to provide increased cooling in those regions. Alternatively, the base of the sealed container, which would normally be formed of a sheet having a constant width or thickness, may be more narrow, in relation to the width or thickness of the rest of the base, in those regions where hot devices are located, to provide increased conductance for heat.

In addition, the base of the sealed container may be formed with internal fluid flow channels, to permit fluid to flow into fluidic pathways and reservoirs formed within a thermally conductive substrate of the photonics components, so that fluid can flow close to specific photonics components, for example lasers in a laser bar. In addition, for other components such as free standing optics, a small reservoir of fluid may be formed close to the optical components, so as to provide a greater amount of thermal control.

Accordingly, there is provided thermal management apparatus for a photonics assembly, comprising an hermetically sealed container mounted within an outer container, and the hermetically sealed container containing a photonics assembly comprising one or more photonics devices, which are mounted on a thermally conductive substrate assembly, which is in contact with a wall portion of said sealed container, the thermally conductive substrate assembly having liquid passageways formed therein to permit liquid to flow close to said photonics devices, said wall portion having inlet and outlet liquid paths communicating with said liquid passageways, and the outer container having a liquid inlet and a liquid outlet, whereby cooling liquid can flow to said photonics devices to remove heat therefrom.

BRIEF DESCRIPTION OF THE DRAWINGS

Preferred embodiments of the invention will now be described, by way of example only, with reference to the accompanying drawings, wherein.

DESCRIPTION OF THE EMBODIMENTS

Figure 1:
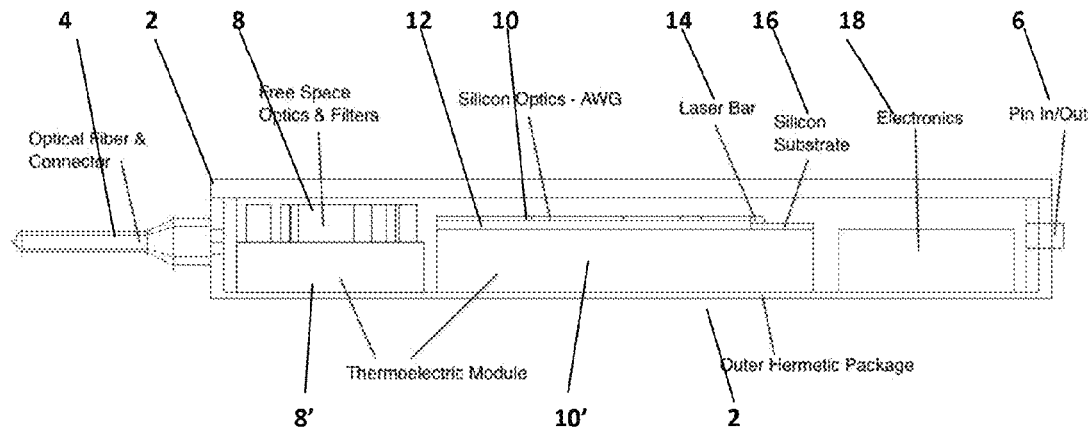
FIG. 1 is a side view of an existing device containing electronics and photonics components, with thermoelectric cooling mechanisms.

In embodiments, liquid flow cools the internal components of an hermetically sealed container, while maintaining the hermetic seal required for the III-V materials and other internal components. An outer container depending on the application can either be a metallic structure with additional machined features for flow control, or a heat insulating material such as plastic for lower cost packaging integration. Whilst the need for a thermoelectric module is avoided, such a module might additionally be employed to improve operating efficiency. However with fluid flow, an internal thermoelectric module need not be used in the hermetically sealed container, resulting in huge power savings. A fluid layer is provided around the hermetically sealed container for conducting away heat while not interfering with electrical input/output pins and optical path connections, which reduces the ambient influence on the internal temperature of the hermetically sealed container and also enables liquid cooling of a silicon substrate or other thermally conductive substrate to which the silicon photonics is thermally connected.

In one embodiment of the invention the outer container surrounds the hermetically sealed container and provides a means of bulk heat dissipation, through liquid cooling of the exterior package. The outer container has ports for fluid flow but also slots for input/output pin connectors. The internal hermetically sealed package has a thermal path to one or more of the other faces allowing for the liquid heat dissipation technique to be employed. Isolation of the internal components from the ambient circuit pack temperature field is done though the use of an insulating layer and a fluidic heat extraction method. The outer structure is a plastic perform with low thermal conductivity but good moisture and solubility repulsion characteristics. The plastic outer structure may also be molded onto the inner package ensuring sufficient sealing at the I/O connections.

One embodiment has an internal surface within the outer container having formations to control the fluid flow within the outer fluid structure. Protuberance formations are designed to improve the lateral distribution of the flow with minimal pressure drop. These formations ensure a sufficient cross section remains for fluid flow over the range of possible test pressures. On the outlet fluid side these formations are to control the radial flow ensuring that regions of flow do not become stagnant or bypassed, reducing the overall effective heat dissipation of the system. Such internal surface may be a preformed board which is encapsulated in the plastic outer container, ensuring a good seal, thermal isolation and the correct cross-sectional area for the required flow regime.

In some embodiments, localized regions of increased heat transfer are provided at the base of the package structure. This increased heat transfer is generated by reducing the cross-sectional area (constricting) of the flow hence increasing the velocity. In another embodiment localized cooling regions are generated by thinning of the inner package material.

One embodiment of the invention has localized fluid connection points in the wall of the hermetic package for attaching a network of fluid flow channels and reservoirs, which are formed within an internal thermal plane, which may be a component substrate, within the hermetically sealed container. Port openings in the internal package allow for fluid to pass from the bulk system cooling to the internal thermal plane. The internal thermal plane includes in its simplest form a number of channels within a thermally conductive substrate assembly, along which the fluid can pass and return back to the bulk system cooling stream. The sealing of this interface between the thermal plane and wall of the sealed container may be implemented by a number of different methods, such as soldering, non-drip connectors, welding, and adhesive bonding. A preferred method is a seal by soldering.

Another embodiment uses a two phase fluid for thermal control of the internal package structure. This approach through preferential density and surface coatings gives a range of heat transfer locations.

Figure 2:
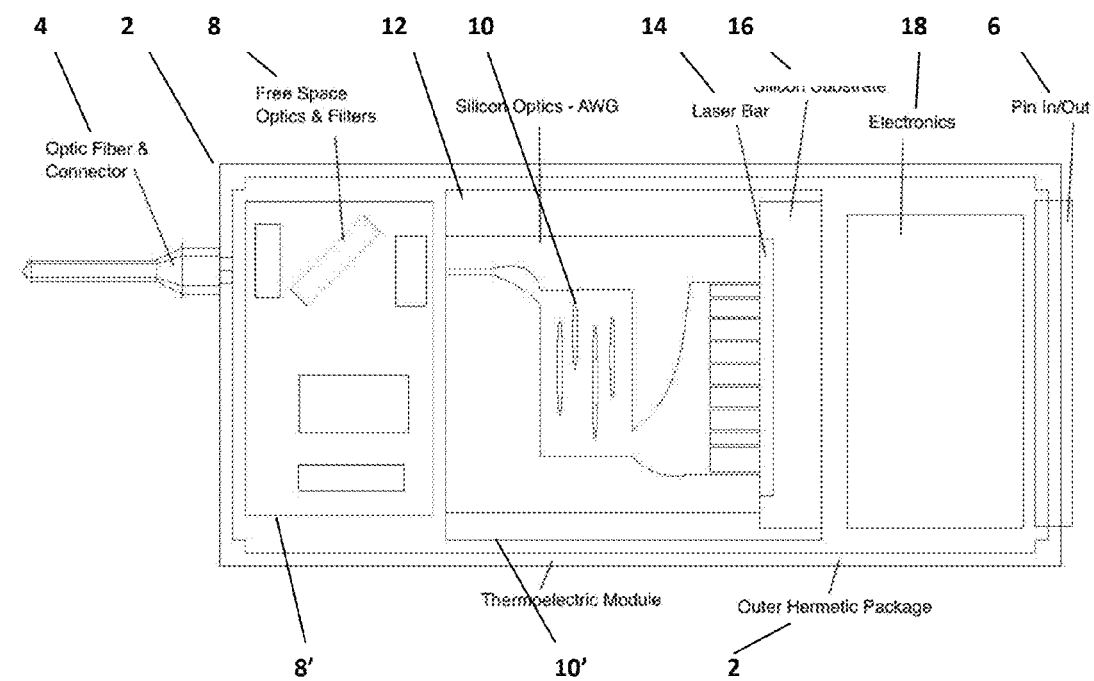
FIG. 2 is a plan view of the structure of FIG. 1.

Referring to FIGS. 1 and 2 which show an existing structure containing electronics and photonics components, the structure comprises a casing 2, which forms an hermetically sealed package having at one end an optical fiber outlet connector 4, and at the opposite end an electrical input/output terminal pin connector 6. These I/O connectors areas are sealed by a number of different methods, e.g. adhesive bonding, pressurized o-rings, welding, seam sealing.

The hermetic package is necessary on account of the need to provide a controlled atmosphere for the optics components and to protect III-V materials. A first unit mounted within the housing comprises free space optics and filters 8 mounted on a thermoelectric module structure 8'. A second unit comprises optics 10 formed as silicon waveguides (AWG) which are formed on a circuit card 12, so as to conduct light from a laser bar 14, which is mounted on a silicon substrate 16. These items are mounted on a second thermoelectric module 10'. A third unit comprises electronics components 18, mounted on a thermal spreader, which couples the electronics to the hermetic package walls. In operation, electrical signals applied to terminal 6 are processed in electronics 18 to provide control signals to laser bar 14, the lasers therein providing light signals which are conducted through the silicon waveguide 10 and free space optics 8 to output optical fiber 4.

Typically the thermoelectric module 10' comprises between 100 and 200 of thermoelectric bumps in an area of 15 mm×15 mm on which silicon heat spreading bar 16, 10×4 mm, is mounted, but other dimensions may be employed. The laser bar comprises a row of 10 lasers, the lasers being spaced apart by 250 microns. A respective resistive heater is mounted with each laser to individually adjust the temperature of the laser. The package shown in FIGS. 1 and 2 is very inefficient at maintaining optimum operating temperatures. Typically, the operating environment of an optoelectronics assembly may be around 55° C., whereas the lasers need to be cooled to an operating temperature of 25° C.

Figure 3:
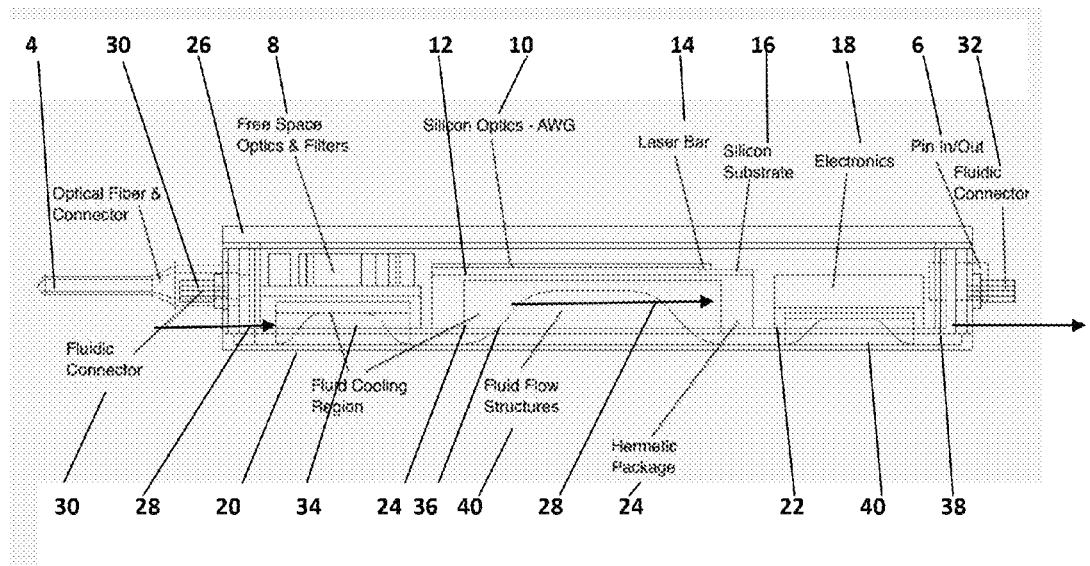
FIG. 3 is a side view of a device forming a first embodiment of the present invention, including fluidic cooling for cooling a photonic and electronic component assembly.
Figure 4:
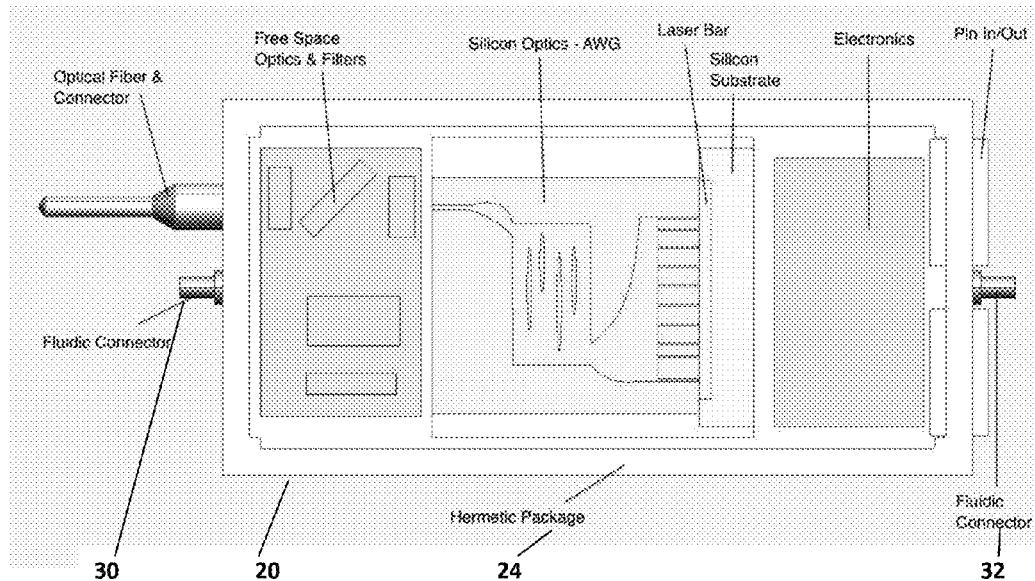
FIG. 4 is a plan view of the structure of FIG. 3.
Figure 5:
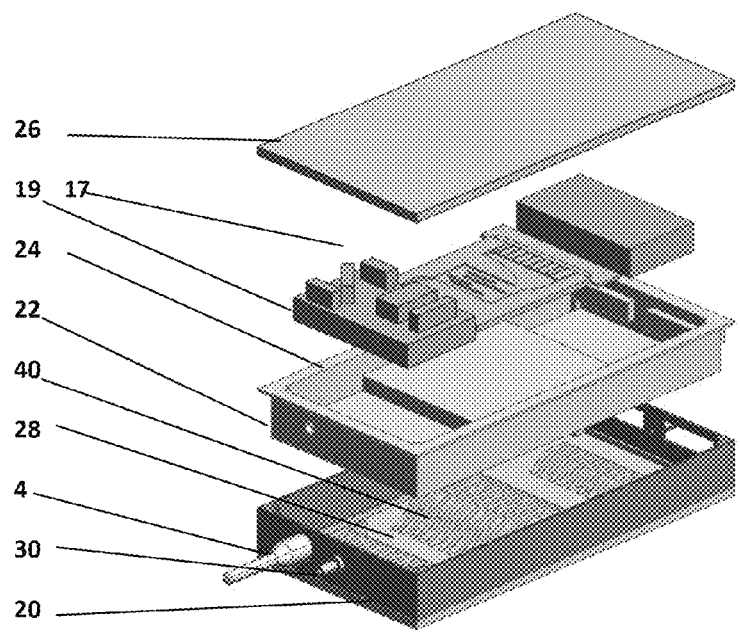
FIG. 5 is an exploded view of the structure of FIG. 3.

Referring now to the first embodiment of the invention shown in FIGS. 3, 4 and 5, similar parts to those of FIGS. 1 and 2 are denoted by the same reference numeral. An outer open container 20 of thermally isolating plastic material receives a registering base portion 22 of a hermetic package 24 (shown in exploded form in FIG. 5), of a thermally conductive metallic material. A top surface 26 of thermally insulating material completes both the hermetic package, and the outer container. The layout of the electronic and photonic components is similar to that of FIGS. 1 and 2, and it may be seen from FIG. 5 that units 8-18 together comprise a single composite assembly 17, with the conductive silicon substrate of each unit 8-18 forming a composite thermally conductive substrate assembly 19. The substrate assembly may be separate substrate units or joined together units, or be formed as an integral unit.

Fluidic cooling of the components is provided as follows. Between container structure 20 and base 22 is provided a fluidic passage 28, which permits fluid to flow between a fluid inlet 30 and a fluid outlet 32 at opposite ends of the tray. The preferred inlet/outlet is an encapsulated ferrule connection encapsulated in the outer plastic packaging during formation. The inlet and outlet fluid connectors are removable and non-dripping. The base 22 has recessed portions 34, 36, 38 disposed respectively beneath optics 8, waveguides 12 and laser bar 14, and electronics 18. This permits fluid to flow close, at the upper surfaces of the recesses 34-38, to the underside of the electronics and photonic components for cooling. In addition, arrays of streamlined parallel planar fluid flow structures 40 are provided within each recess to direct fluid flow close to base 22, and to increase fluid flow rate by means of the Bernoulli Effect.

Figure 8:
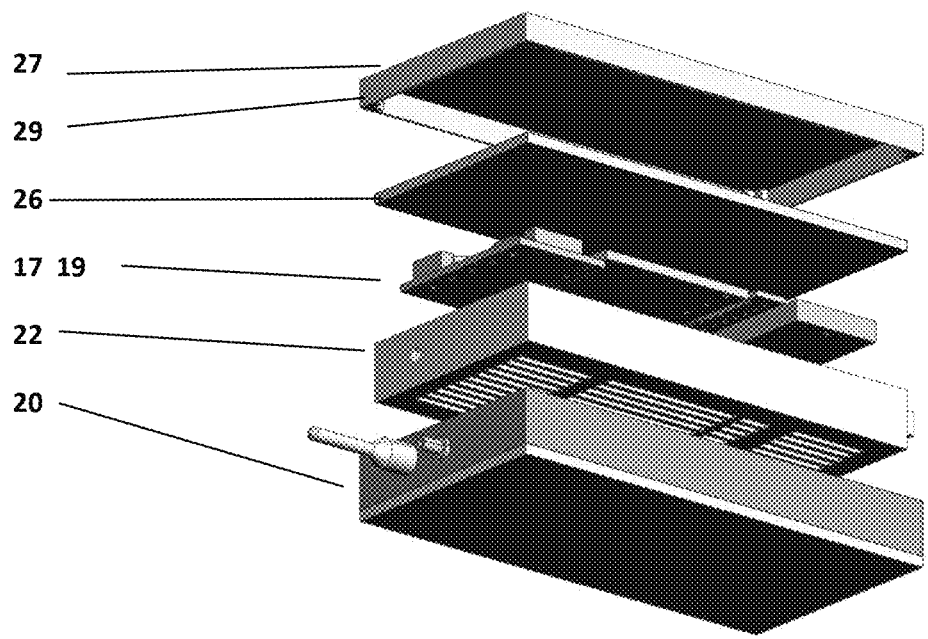
FIG. 8 is an exploded view of the structure of FIG. 6 viewed from below.
Figure 9:
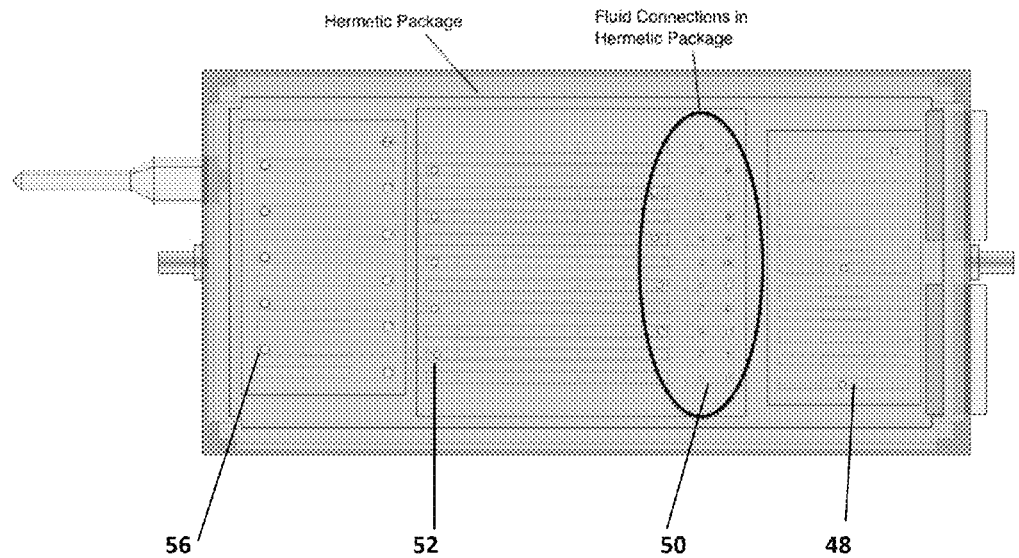
FIG. 9 is a plan view showing the base of an hermetic package of FIG. 6, showing fluid flow connections.

Referring now to the second embodiment shown in FIGS. 6 to 11, similar parts to those of FIGS. 3 to 5 are denoted by the same reference numerals. Referring firstly to FIG. 8, the outer container 20 has a top cover 27 of insulating material, with side flanges 29 which overlap base 20, to completely envelope sealed container 24. In this case top 26 of container 24 may be thermally conductive. For clarity, top 27 is not shown in FIGS. 6 and 7.

Figure 6:
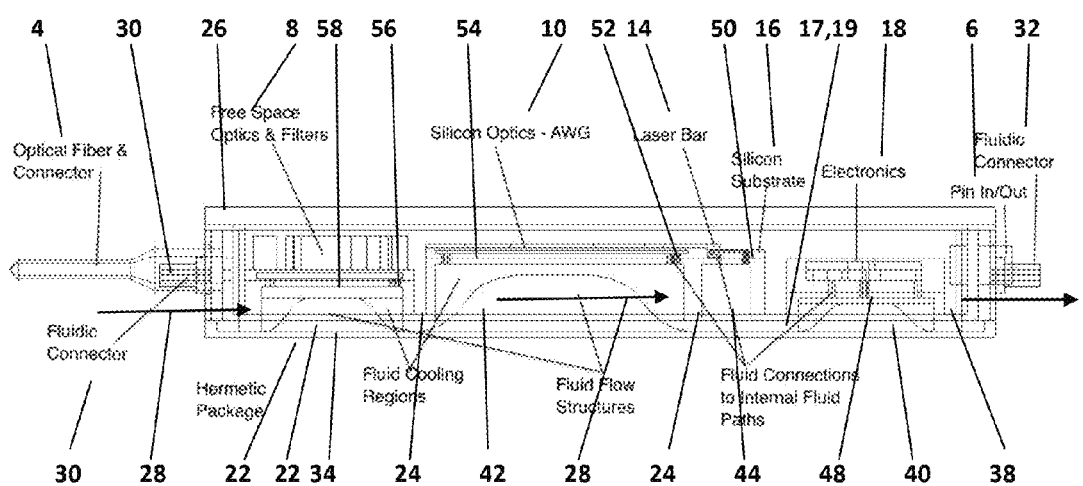
FIG. 6 is a side view of a device forming a second embodiment of the present invention, including fluidic cooling for cooling a photonic and electronic component assembly.
Figure 7:
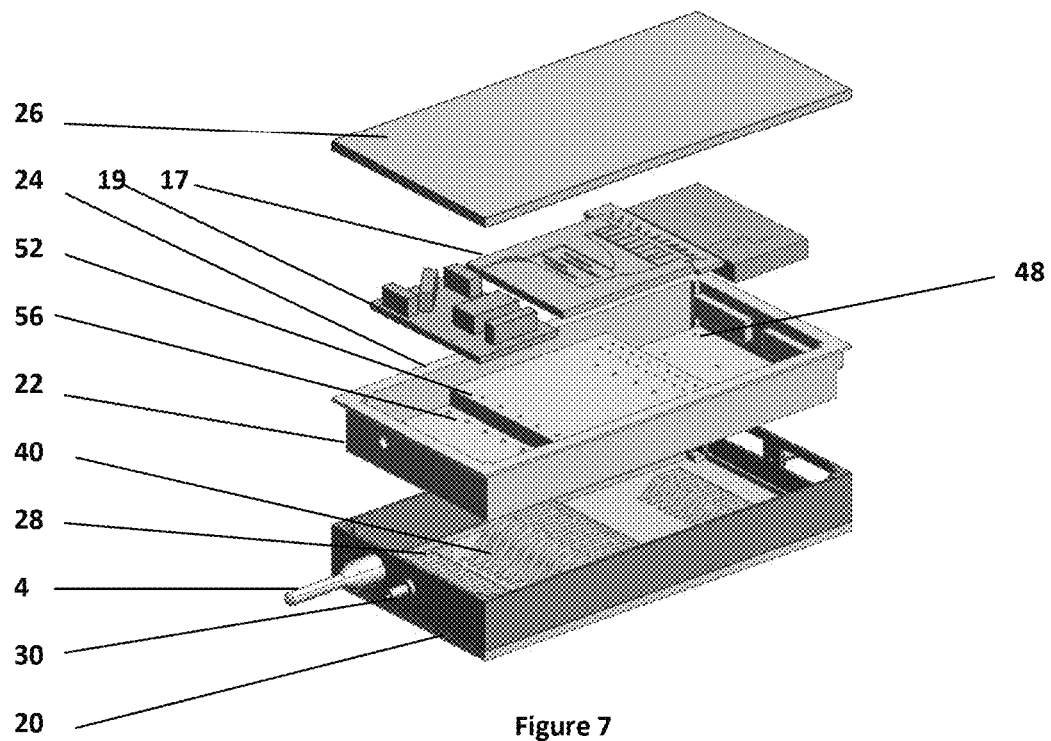
FIG. 7 is an exploded view of the structure of FIG. 6 viewed from above.

In FIG. 6, recess 36 of FIG. 3 has been modified as a first recess 42 beneath waveguides 12 separated by an intervening wall from a second recess 44 disposed beneath laser bar 14. Although the base 22 retains the hermetic seal of the first embodiment, the upper floor of each recess is formed with internal inlet and outlet fluid flow paths, directed to the electronics and photonics components. Thus in recess 38, see FIGS. 6 and 9, fluid flow paths 48 are provided for conducting fluid into contact with electronics components. In recess 44, fluid paths 50 are provided which are disposed adjacent laser bar 14.

Figure 10:
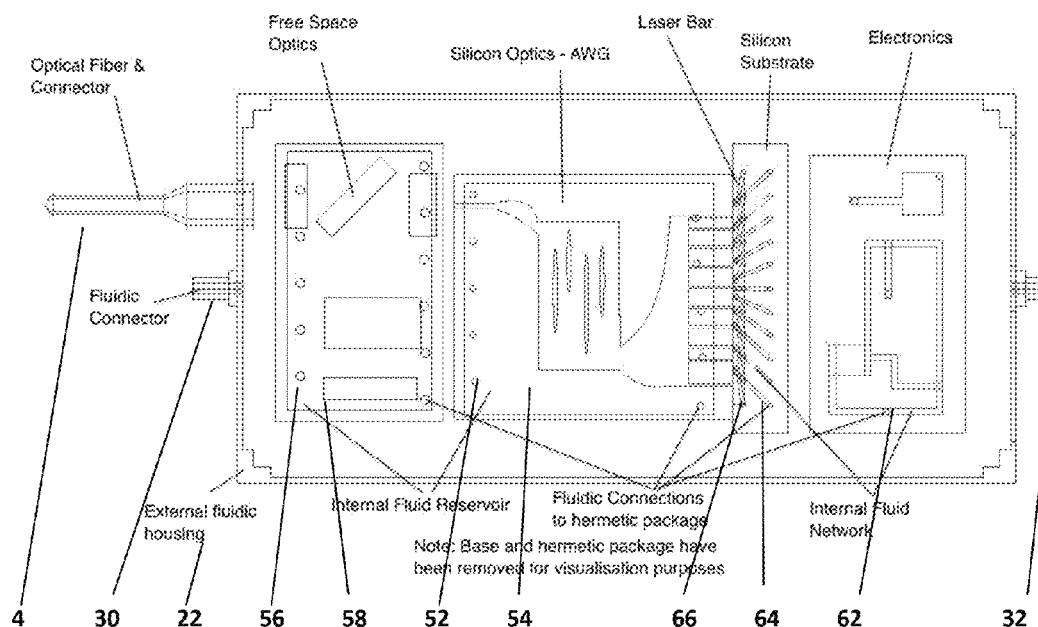
FIG. 10 is a plan view of the structure of FIG. 6 from the underside with base components removed to show fluid flow paths.
Figure 11:
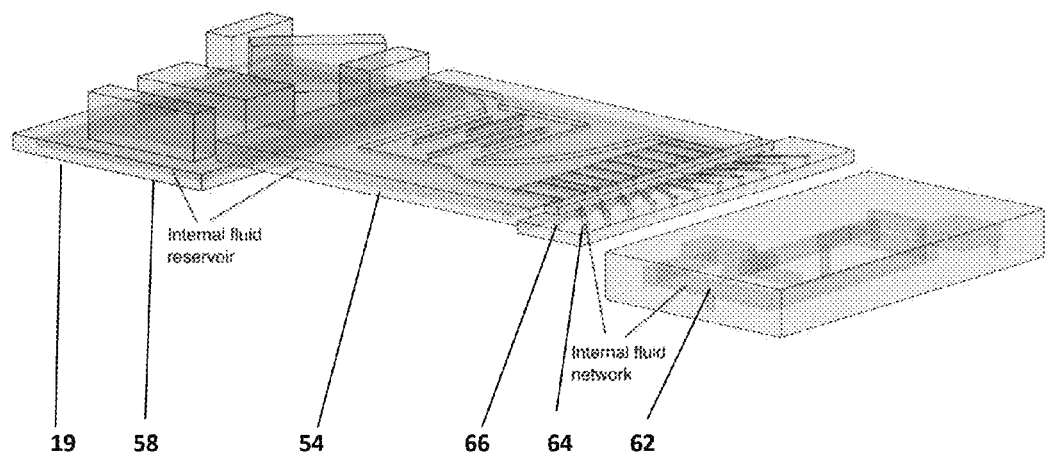
FIG. 11 is a perspective view of the fluidic path and reservoir components of the structure of FIG. 6.

In recess 42, fluid paths 52 are provided, disposed directly adjacent waveguide structure 12. In recess 34, fluid paths 56 are provided which are disposed directly adjacent optics 8. These fluid flow paths 48-56 make sealed connections with fluid flow channels which are formed within the silicon of composite thermal substrate assembly 19 (by known processing techniques), as shown in FIGS. 10 and 11 in particular. These fluid flow channels comprise a fluid flow network 62 coupled to paths 48 for contacting the electronic components with cooling fluid. For laser bar 14, there are fluid input channels 64 in substrate 19 to conduct fluid to the laser bar. Fluid outlet channels 66 permit fluid to flow away from laser bar 14 back into recess 42 via paths 50.

Fluid flow paths 52 in recess 42 communicate with a reservoir 54 disposed beneath AWG structure 10. Fluid flow paths 56 in recess 34 communicate with a reservoir 58 disposed beneath free standing optics 8.

Figure 12:
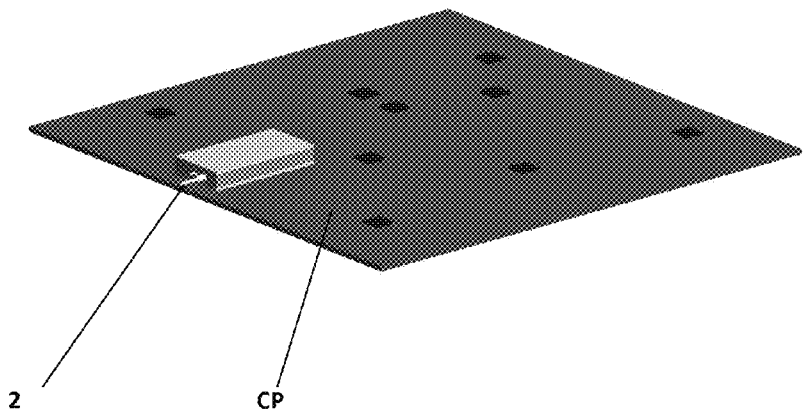
FIG. 12 is a schematic view of the device of the first or second embodiments located on a circuit board.

FIG. 12 shows the complete device 2 of the first or second embodiments, in position mounted on a circuit pack CP.

Advantages of embodiments are reduced power consumption, localized thermal control for local component set points, internal component thermal isolation from the circuit pack ambient, removal of the thermoelectric module, all while maintaining an hermetic seal and the numerous input and output connections. Further advantages are: improved thermal control—maintaining the correct temperature to ensure the correct optical wavelength; improved heat dissipation—extracting larger heat loads from smaller areas; improved thermal isolation—reduced thermal crosstalk across optical signals due to thermal differences, this aspect will improve transition times of operation and allow for greater functionality of the optical components; removal of the thermoelectric module—significantly reducing the overall power consumption of the module; modular assembly—improving the isolation of the interior components from external influences which maintaining a clear heat dissipation path for efficient thermal operation.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. A thermal management apparatus for an electrical and/or optical component assembly, comprising:

an hermetically sealed container mounted within an outer container, the outer container having a liquid inlet and a liquid outlet, said outer container and said hermetically sealed container configured to define a liquid path operable to direct a liquid within the outer container and around the hermetically sealed container to remove heat therefrom, and the hermetically sealed container containing said component assembly, which assembly includes one or more devices, which devices are in thermal communication with a thermally conductive wall portion of said sealed container, whereby said liquid cools said devices, wherein at least two of the devices that are contained within the outer container are also contained within the hermetically sealed container.

2. The thermal management apparatus according to claim 1 wherein the sealed container has a base portion and side walls of a thermally conductive material.

3. The thermal management apparatus according to claim 2, wherein a base and side walls of the outer container are formed of a thermally insulative material.

4. The thermal management apparatus according to claim 3, wherein the outer container is formed as a close fit to the sides of the sealed container, or is formed as plastics extrusion moulded to the sealed container.

5. The thermal management apparatus according to claim 2, wherein the sealed container and the outer container have a common top portion formed of thermally insulative material, or have separate top portions of conductive and insulative material respectively.

6. The thermal management apparatus according to claim 1, wherein said outer container has liquid flow structures formed in said liquid flow path to direct liquid flow.

7. The thermal management apparatus according to claim 1, wherein the outer container includes a liquid inlet, which is coupled to a source of cooling liquid, and a liquid outlet.

8. The thermal management apparatus according to claim 1, wherein said one of more devices include a photonics device, preferably a laser bar comprising a plurality of lasers.

9. The thermal management apparatus according to claim 8, wherein said liquid passageways include at least one liquid reservoir located beneath at least one photonics device.

10. The thermal management apparatus as recited in claim 1, wherein a majority of the devices that are contained within the outer container are also contained within the hermetically sealed container.

11. A thermal management apparatus for an electrical and/or optical component assembly, comprising:

an hermetically sealed container mounted within an outer container, the outer container having a liquid inlet and a liquid outlet, said outer container and said hermetically sealed container configured to define a liquid path operable to direct a liquid within the outer container and around the hermetically sealed container to remove heat therefrom, and the hermetically sealed container containing said component assembly, which assembly includes one or more devices, which devices are in thermal communication with a thermally conductive wall portion of said sealed container, whereby said liquid cools said devices, wherein said one or more devices are mounted on a thermally conductive substrate assembly which is sealed to and in good thermal contact with a base region of the sealed container.

12. The thermal management apparatus according to claim 11, wherein said substrate assembly is formed with liquid flow channels which communicate with liquid inlets and outlets in the base region of the sealed container, in order to permit liquid flow from said liquid flow path close to specific photonics devices.

13. The thermal management apparatus according to claim 11, wherein said substrate assembly is formed with liquid reservoirs which communicate with liquid inlets and outlets in the base region of the sealed container.

14. A thermal management apparatus for an electrical and optical component assembly, comprising:

an hermetically sealed container mounted within an outer container, the outer container having a liquid inlet and a liquid outlet, said outer container and said hermetically sealed container configured to define a liquid path operable to direct a liquid within the outer container and around the hermetically sealed container to remove heat therefrom, and the hermetically sealed container containing said component assembly, which assembly includes one or more devices, which devices are in thermal communication with a thermally conductive wall portion of said sealed container, whereby said liquid cools said devices, wherein said outer container has liquid flow structures formed in said liquid flow path to direct liquid flow further comprising raised liquid flow structures to encourage liquid flow at an increased rate close to specific areas of the base of the sealed container.

15. The thermal management apparatus according to claim 14, wherein said raised liquid flow structures are located in one or more recesses of the base of the sealed container.

16. Thermal management apparatus for a photonics assembly, comprising an hermetically sealed container mounted within an outer container, and the hermetically sealed container containing a photonics assembly comprising one or more photonics devices, which are mounted on a thermally conductive substrate assembly, which is sealed to and in thermal contact with a wall portion of said sealed container, the thermally conductive substrate assembly having liquid passageways formed therein to permit liquid to flow close to said photonics devices, said wall portion having inlet and outlet liquid paths communicating with said liquid passageways, and the outer container having a liquid inlet and a liquid outlet, so as to provide a cooling liquid flow path between said liquid inlet and outlet via said photonics devices to remove heat therefrom.

* * * * *